United States Patent
Manderscheid

(10) Patent No.: US 7,127,133 B2
(45) Date of Patent: Oct. 24, 2006

(54) MONOLITHICALLY INTEGRATED OPTIC TRIPLEXER AND METHOD FOR MAKING SAME

(75) Inventor: Richard M. Manderscheid, Dallas, TX (US)

(73) Assignee: Alcatel, Paris (FR)

( * ) Notice: Subject to any disclaimer, the term of this patent is extended or adjusted under 35 U.S.C. 154(b) by 8 days.

(21) Appl. No.: 10/796,955

(22) Filed: Mar. 10, 2004

(65) Prior Publication Data

US 2005/0201665 A1    Sep. 15, 2005

(51) Int. Cl.
G02B 6/12 (2006.01)
G02B 6/36 (2006.01)
H01S 3/08 (2006.01)
H04J 14/02 (2006.01)
H01L 27/05 (2006.01)
H01L 21/00 (2006.01)

(52) U.S. Cl. ............................ 385/14; 385/88; 385/89; 385/92; 385/94; 372/96; 398/79; 398/85; 257/79; 257/80; 257/84; 438/29; 438/31

(58) Field of Classification Search ................ 385/14, 385/88, 89, 92, 94; 372/96; 398/85, 43, 398/79; 257/79, 80, 84; 438/29, 31
See application file for complete search history.

(56) References Cited

U.S. PATENT DOCUMENTS

| 4,110,778 | A * | 8/1978 | Eden et al. ................. 257/186 |
| 5,914,976 | A | 6/1999 | Jayaraman et al. |
| 6,271,943 | B1 * | 8/2001 | Goossen ........................ 398/9 |
| 6,536,957 | B1 * | 3/2003 | Buchter ....................... 385/89 |
| 2002/0163952 | A1 * | 11/2002 | Hwang et al. ................ 372/96 |
| 2003/0053171 | A1 | 3/2003 | Baumann et al. |
| 2003/0090320 | A1 | 5/2003 | Skrobko et al. ............ 330/195 |
| 2003/0113053 | A1 * | 6/2003 | Kuramata ..................... 385/14 |
| 2003/0113059 | A1 | 6/2003 | BuAbbud ..................... 385/24 |
| 2003/0124984 | A1 | 7/2003 | Shin et al. .................... 455/78 |
| 2003/0147601 | A1 * | 8/2003 | Bartur et al. ................. 385/92 |
| 2003/0186674 | A1 | 10/2003 | Keeney et al. .............. 455/347 |
| 2004/0007709 | A1 * | 1/2004 | Kondo ........................ 257/80 |
| 2004/0042736 | A1 | 3/2004 | Capewell et al. |

FOREIGN PATENT DOCUMENTS

| GB | 2378069 A | 1/2003 |
| JP | 11 330532 A | 11/1999 |
| WO | WO 2005/013517 A2 | 2/2005 |

OTHER PUBLICATIONS

BROCHURE "LBit Bi-directional Optical Modules with Video channel" Fiber-Optic Devices Inc., 1 page (no date).
VCSEL (Vertical Cavity Surface Emitting Laser), http://www.lasermate.com/vcsel.htm, 2 pages (downloaded Nov. 19, 2003).
BROCHURE "1310/1490/1555nm Integrated Triplexer", Luminent, 3 pages (no date).
BROCHURE "LPTP001—Preliminary Specification", Afonics, 7 pages, Jan. 7, 2003.

* cited by examiner

*Primary Examiner*—Brian Healy
*Assistant Examiner*—Jerry Martin Blevins
(74) *Attorney, Agent, or Firm*—William J. Tucker; Bobby D. Slaton; V. Lawrence Sewell

(57) ABSTRACT

A monolithically integrated optic triplexer is described herein that can be mounted in one transistor outline (TO) can and can be used in a passive optical network. The monolithically integrated optic triplexer includes: an emitting laser; at least a first photodiode that is capable of receiving an optical signal; and a thin film filter that is located between the emitting laser and the first photodiode. In addition, the monolithically integrated optic triplexer may include a thin film filter that is located between the first photodiode and a second photodiode. Also described herein is a method for making the monolithically integrated optic triplexer.

12 Claims, 5 Drawing Sheets

MONOLITHICALLY INTEGRATED OPTIC TRIPLEXER AND METHOD FOR MAKING SAME

BACKGROUND OF THE INVENTION

1. Field of the Invention

The present invention relates in general to a monolithically integrated optic triplexer that can be mounted in one transistor outline (TO) can and used in a passive optical network.

2. Description of Related Art

Referring to FIG. 1 (PRIOR ART), there is a block diagram that illustrates the basic components of a passive optical network (PON) 100 which incorporates a traditional optic triplexer 102 that enables video, voice and data to be delivered to an end-user 104 and data to be received from the end-user 104 (one shown). The PON 100 includes an optical line termination module (OLT) 106, an optical distribution network (ODN) 108 and one or more optical termination modules (ONTs) 110 (five shown). As shown, the OLT 106 interfaces with a public switched telephone network (PSTN) 112 which enables voice to be delivered to the end-user 104 via a plain old telephone service (POTS) device 114 (e.g., telephone 114). In addition, the OLT 106 interfaces with an asynchronous transfer mode/internet protocol (ATM/IP) network 116 which enables data to be delivered to the end-user 104 via a personal computer (PC) 118. Moreover, the OLT 106 interfaces with a video provider 120 which enables video to be delivered to the end-user 104 via a television 122. Typically, the voice/data are transmitted to the end-user 104 on a 1485–1495 nm band (e.g., 1490 nm optical signal). The video is transmitted to the end-user 104 on a 1545–1555 nm band (e.g., 1550 nm optical signal). And, the data is received from the end-user 104 on a 1307–13110 nm band (e.g., 1310 nm optical signal). As shown, the ONT 110 incorporates a collimating optic 122 and the traditional optic triplexer 102. Basically, the traditional optic triplexer 102 performs the optical-to-electrical conversions on the voice/data signals in the 1490 nm optical and on the television signals in the 1550 nm optical. In addition, the traditional optic triplexer 102 performs the electrical-to-optic conversion on the data signals in the 1310 nm optical. A more detailed discussion about the traditional optic triplexer 102 is provided below with respect to FIG. 2.

Referring to FIG. 2 (PRIOR ART), there is a block diagram that illustrates the basic components of the traditional optic triplexer 102. The traditional optic triplexer 102 includes three cylindrical transistor outline (TO) packages or TO cans 202, 204 and 206 and at least two thin film filters (TFFs) 208 and 210. As shown, the traditional optic triplexer 102 outputs one signal 214 (data on the 1310 nm optical signal 214) and receives two signals 216 and 218 (voice/data on the 1490 nm optical signal 216 and video on the 1550 nm optical signal 218) to and from the collimating optic 122. The first TFF 208 reflects signal 218 (1550 nm signal 218) output from the collimating optic 212 into TO can 202 which includes a broadband PIN photodiode 220. The PIN photodiode 220 detects the 1550 nm signal 218 which is associated with analog Cable Television (CATV) and converts the optical signal into an electrical signal that is sent to the television 122 (see FIG. 1). The first TFF 208 also transmits or lets pass through it signals 214 and 216. The second TFF 210 reflects signal 216 (1490 nm signal 216) output from the collimating optic 212 into TO can 204 which includes a standard PIN+TIA photodiode 222. The PIN+TIA photodiode 222 detects the 1490 nm signal 216 which is associated with 622 Mb/s digital data and converts the optical signal into an electrical signal that is sent to the POTS 114 or PC 118 (see FIG. 1). The second TFF 210 also transmits or lets pass through it signal 214. The TO can 206 includes an emitting laser 224 that transmits the optical signal 214 (1310 nm signal 214) which was originally an electrical signal received from the end-user 104 (see FIG. 1). The transmitted signal 214 passes through the TFFs 208 and 210 and enters the collimating optic 122 before being transmitted to the OLT 106 (see FIG. 1). In some designs, a third TFF 226 is added to help isolate reflected signal 218 before it is received by TO can 202.

A major drawback of the traditional optic triplexer 102 is that it is expensive to manufacture because it has a large number of discrete components. Another drawback of the traditional optic triplexer 100 is that it is difficult to properly align all of those components with the collimating lens 122. Accordingly, there is a need for a new optic triplexer that addresses and solves the aforementioned drawbacks and other drawbacks associated with the traditional optic triplexer. These needs and other needs are addressed by the optic triplexer and method of the present invention.

BRIEF DESCRIPTION OF THE INVENTION

The present invention includes a monolithically integrated optic triplexer that can be mounted in one transistor outline (TO) can and can be used in a passive optical network. The monolithically integrated optic triplexer includes: (1) an emitting laser that is capable of transmitting a 1310+/−10 nm optical signal; (2) a first photodiode that is capable of receiving a 1490+/−5 nm optical signal; and (3) a second photodiode that is capable of receiving a 1550+/−5 nm optical signal. In one embodiment, the emitting laser is placed on top of the two photodiodes which are monolithically integrated on a substrate. And in another embodiment, the emitting laser and two photodiodes are all monolithically integrated on a substrate. The monolithically integrated optic triplexer may also include a thin film filter that is located between the emitting laser and the first photodiode. In addition, the monolithically integrated optic triplexer may include a thin film filter that is located between the first photodiode and the second photodiode. Also described herein is a method for making the monolithically integrated optic triplexer.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Figure 3:
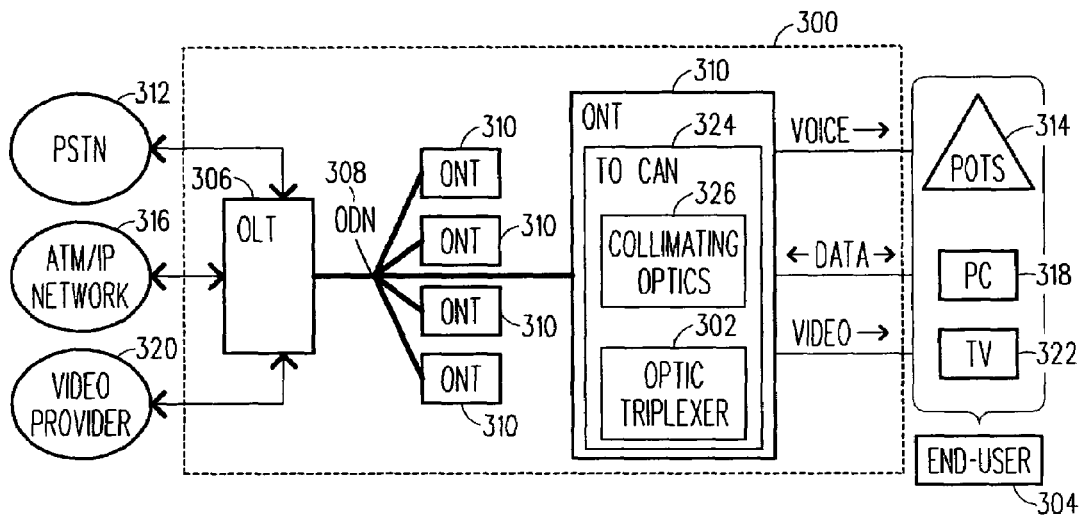
FIG. 3 is a block diagram that illustrates the basic components of a PON which incorporates an optic triplexer in accordance with the present invention.

Referring to FIG. 3, there is a block diagram that illustrates the basic components of a PON 300 which incorporates an optic triplexer 302 of the present invention that enables video, voice and data to be delivered to an end-user 304 and data to be received from the end-user 304 (one shown). It should be appreciated that certain details associated with the components that make-up the PON 300 are well known in the industry. Therefore, for clarity, the description provided below in relation to the PON 300 omits a detailed discussion about those well known components that are not necessary to understand the present invention.

The PON 300 includes an OLT 306, an ODN 308 and one or more ONTs 310 (five shown). As shown, the OLT 306 interfaces with a PSTN 312 which enables voice to be delivered to the end-user 304 via a POTS device 314 (e.g., telephone 314). In addition, the OLT 306 interfaces with an ATM/IP network 316 which enables data to be delivered to the end-user 304 via a PC 318. Moreover, the OLT 306 interfaces with a video provider 320 which enables video to be delivered to the end-user 304 via a television 322. Typically, the voice/data are transmitted to the end-user 304 on a 1485–1495 nm band (e.g., 1490 nm optical signal). The video is transmitted to the end-user 304 on a 1545–1555 nm band (e.g., 1550 nm optical signal). And, the data is received from the end-user 304 on a 1307–1310 nm band (e.g., 1310 nm optical signal).

As shown, the ONT 310 in addition to containing well known components like an E/O receiver, an PON-PHY E/G and a PON TC (for example) also contains a TO can 324 that incorporates collimating optics 326 and an optic triplexer 302. The TO can 324 is preferably an industry standard Transmit Optical Sub Assembly (TOSA) package which can be attached to fiber optic receptacles. A detailed discussion about the optic triplexer 302 is provided below with respect to FIGS. 4–6.

Figure 4:
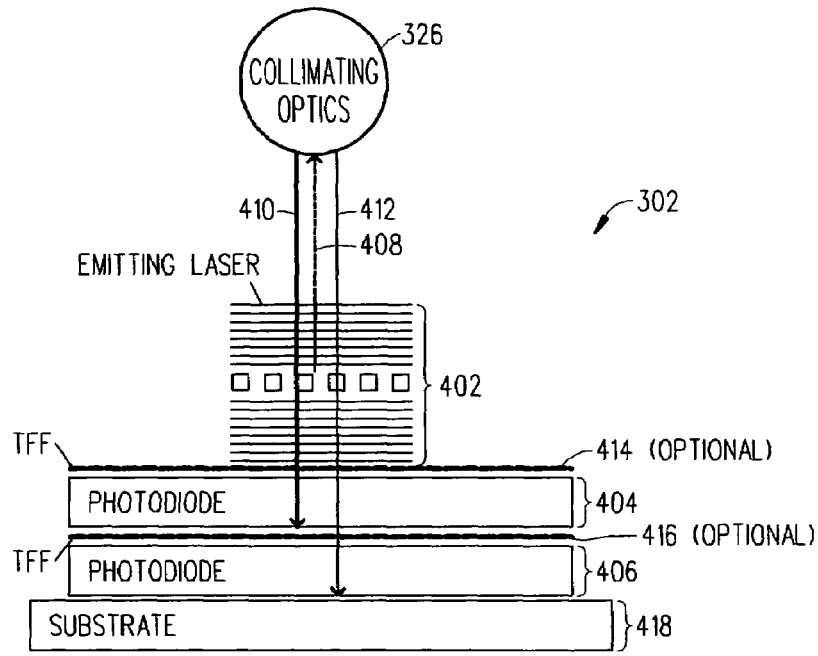
FIG. 4 is a block diagram that illustrates in greater detail the components of the optic triplexer shown in FIG. 3.

Referring to FIG. 4, there is a block diagram that illustrates the basic components of the optic triplexer 302. The optic triplexer 302 includes an emitting laser 402 and two photodiodes 404 and 406. The emitting laser 402 (e.g., a vertical cavity surface emitting laser (VCSEL) 402) is directly modulated at 155 Mb/s in a burst mode and transmits the modulated data in a 1310+/–10 nm optical signal 408. As can be seen, the emitting laser 402 is nominally transparent to light signals 410 and 412 at 1490 nm and 1550 nm. To help ensure the proper isolation between signal 408 and signals 410 and 412 a 1310+/–10 nm reflective TFF 414 (optional) may be located between the emitting laser 402 and photodiode 404. The TFF 414 reflects the 1310 nm optical signal 408 and transmits the 1490 nm and 1550 nm optical signals 410 and 412. The photodiode 404 (e.g., PIN+TIA photodiode 404) receives voice/data signals on the 1490+/–5 nm optical signal 410. As can be seen, the photodiode 404 is nominally transparent to 1550 nm light signal 412. But, to help ensure the proper isolation between signals 410 and 412 a 1490+/–5 nm reflective TFF 416 (optional) may be located between the photodiodes 404 and 406. The TFF 416 reflects the 1490 nm optical signal 410 and transmits the 1550 nm optical signal 412. The photodiode 406 (e.g., PIN photodiode 406) receives television signals on the 1550+/–5 nm optical signal 412. In this way, the optic triplexer 302 performs an electrical-to-optic conversion on the data signals in the 1310 nm optical signal 408. And, the optic triplexer 302 performs optical-to-electrical conversions on the voice/data signals in the 1490 nm optical signal 410 and on the television signals in the 1550 nm optical signal 412.

Figure 1:
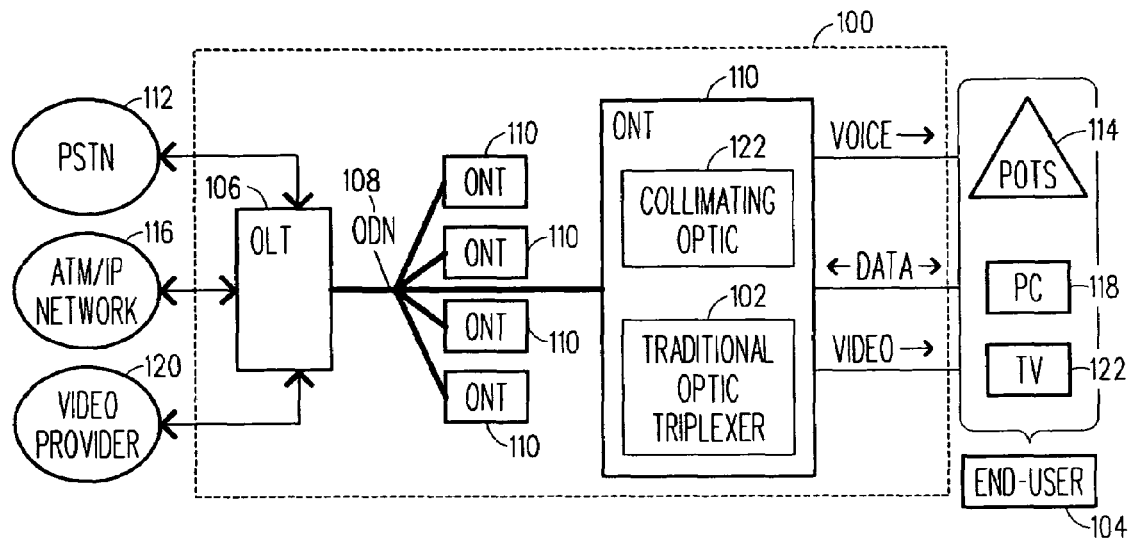
FIG. 1 (PRIOR ART) is a block diagram that illustrates the basic components of a PON which incorporates a traditional optic triplexer.
Figure 2:
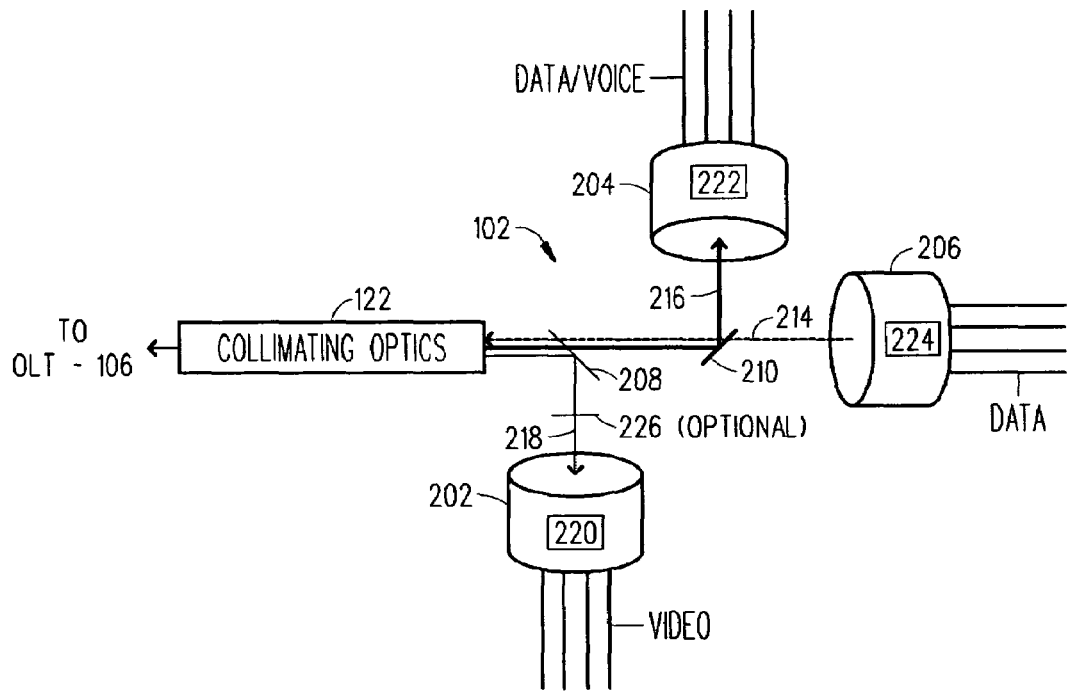
FIG. 2 (PRIOR ART) is a block diagram that illustrates in greater detail the components of the traditional optic triplexer shown in FIG. 1.

In one embodiment, the emitting laser 402 and both photodiodes 404 and 406 are all monolithically formed or integrated on a substrate 418 (e.g., InGaAs substrate 418). However, since the emitting laser 402 (e.g., VCSEL 402) may have a lower manufacturing yield rate than either of the photodiodes 404 and 406 it may be beneficial to monolithically integrate both photodiodes 404 and 406 on the substrate 418 (e.g., die 414) and then place the emitting laser 402 on top of photodiode 404. Of course, if the TFFs 414 and/or 416 are used they would also be formed (e.g., monolithically formed) between the emitting laser 402 and photodiodes 404 and 406. Either of these embodiments is a marked improvement over the traditional optic triplexer 102 (see FIG. 1) which is made from TO can 202 (containing photodiode 220), TO can 204 (containing photodiode 222) and TO can 206 (containing emitting laser 224) and at least two thin film filters (TFFs) 208 and 210. Again, the traditional optic triplexer 102 is expensive to manufacture because it has such a large number of discrete components and it is also difficult to properly align all of those components.

Figure 5:
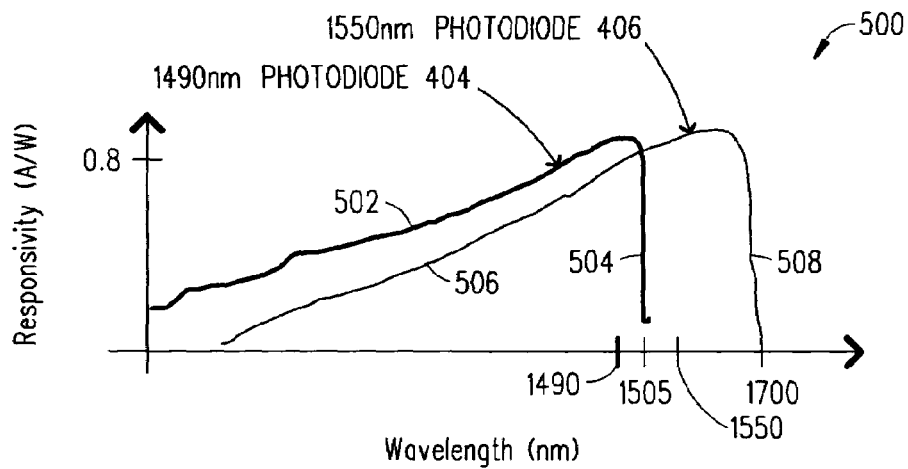
FIG. 5 is a graph that shows the responsivity curves of two photodiodes that are incorporated within the optic triplexer shown in FIG. 4.

Referring to FIG. 5, there is a graph 500 that illustrates the responsivity curves of photodiodes 404 and 406 that are located in the optic triplexer 302. As can be seen, photodiode 404 has a responsivity curve 502 that has cutoff wavelength 504 (steep portion of the curve) which is at 1505 nm optical (for example). As such, the photodiode 404 detects and absorbs a signal (e.g., 1490 nm optical signal 410) that is below the cutoff wavelength 504 and passes through a signal (e.g., 1550 nm optical signal 412) that is above the cutoff wavelength 504. The photodiode 404 after absorbing signal 410 and passing signal 412 outputs an electrical signal that has a responsivity indicated on the Y-axis of graph 500. Likewise, photodiode 406 has a responsivity curve 506 that has cutoff wavelength 508 which is longer than the longest received wavelength in the device at 1700 nm optical (for example). As such, the photodiode 406 detects and absorbs a signal (e.g., 1550 nm optical signal 412) that is below the cutoff wavelength 508 and passes through a signal (e.g., 1750 nm optical signal) that is above the cutoff wavelength 508. The photodiode 406 after absorbing signal 412 outputs an electrical signal that has a current indicated on the Y-axis of graph 500 The photodiode 406 does not absorb signal 410 since that signal would have already been absorbed by photodiode 404. It should be noted that anyone of the cutoff wavelengths 504 and 508 can be tuned in wavelength simply by changing a bandgap in the absorption region of the substrate 418. For instance, in the InGaAs process one can change the relative dopant concentrations between Ga (Gallium) and As (Arsenide) to change the bandgaps and tune the cutoff wavelengths 504 and 508. It should be appreciated that the wavelengths used in FIGS. 4 and 5 are exemplary and can be changed depending on the particular application of the optic triplexer 302.

Figure 6:
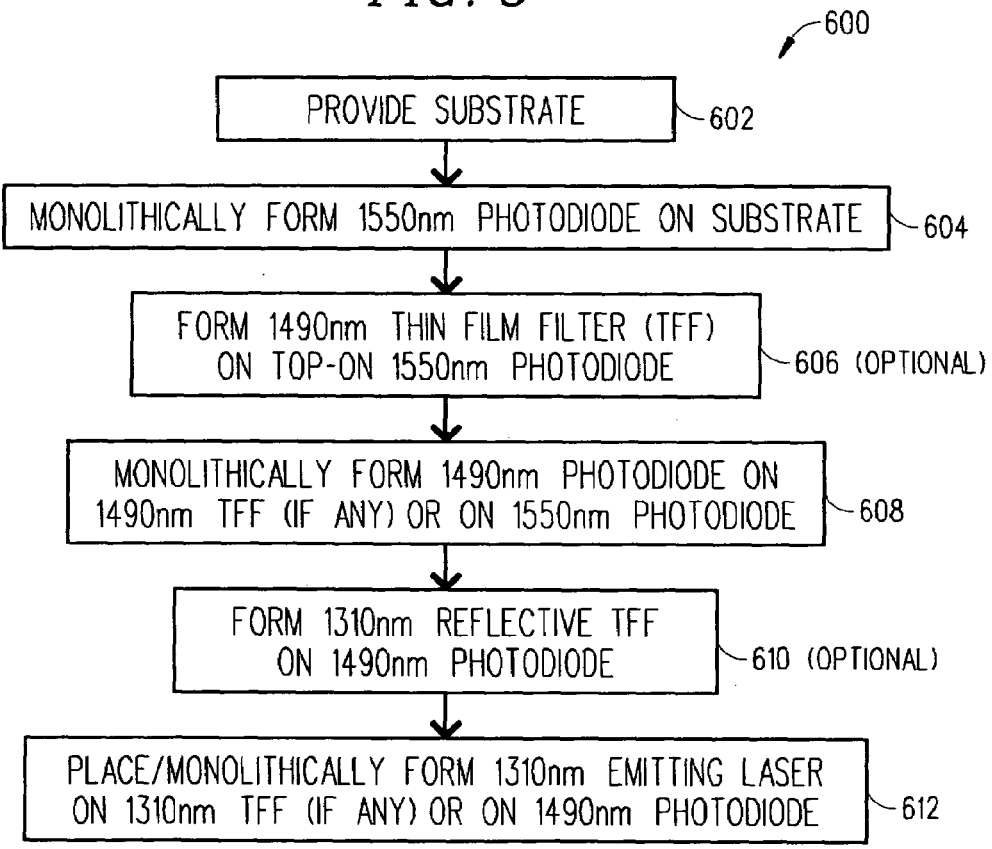
FIG. 6 is a flowchart of the basic steps of a preferred method for making the optic triplexer shown in FIG. 4 in accordance with the present invention.

Referring to FIG. 6, there is a flowchart that illustrates the basic steps of a preferred method 600 for making the optic triplexer 302 in accordance with the present invention. The optic triplexer 302 can be made by providing (step 602) the substrate 418 and then monolithically forming (step 604) the 1550 nm photodiode 406 (see FIG. 1). The 1490 nm reflective TFF 416 (optional) can then be formed (step 606) on top of the 1550 nm photodiode 406. Then the 1490 nm photodiode 404 is monolithically formed (step 608) on top of the 1490 nm reflective TFF 416 if it is present or on top of the 1550 nm photodiode 406. The 1310 nm reflective TFF 414 (optional) can then be formed (step 610) on top of the 1490 nm photodiode 404. Thereafter, the 1310 nm emitting laser 402 is placed or monolithically formed (step 612) on top of the 1310 nm reflective TFF 414 if it is present or on top of the 1490 nm photodiode 404 to form the optic triplexer 302 (see FIG. 4). It should be appreciated that all of the components (e.g., pins, TFFs, sources) can be integrated in a hybrid manner to make the optic triplexer 302.

Figure 7:
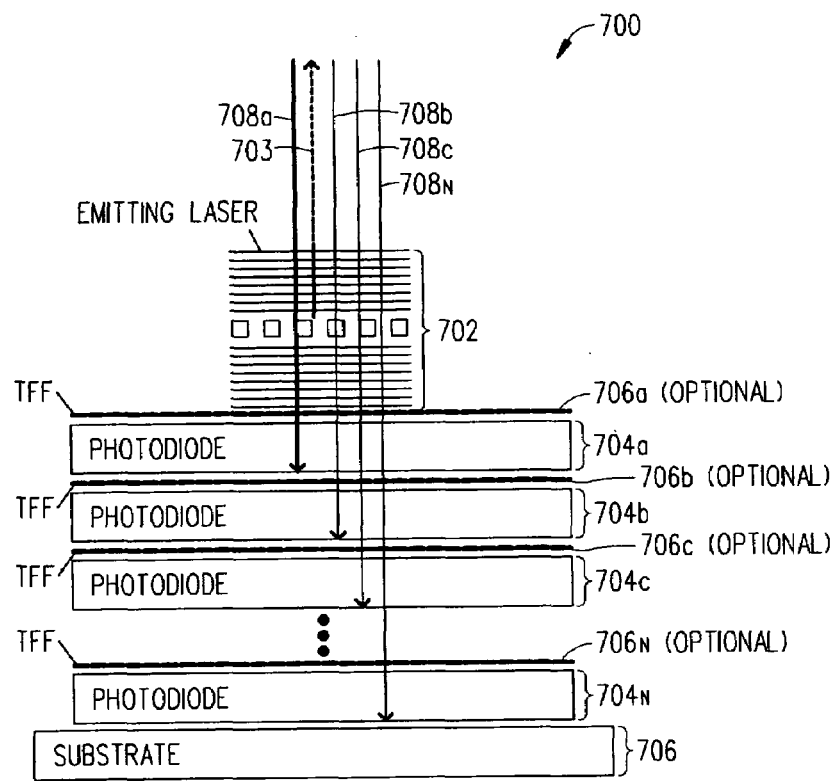
FIG. 7 is a block diagram that illustrates the basic components of an optic demultiplexer that can be made in accordance with another embodiment of the present invention.

Referring to FIG. 7, there is a block diagram that illustrates the basic components of an optic multiplexer 700 that can be made in accordance with another embodiment of the present invention. Basically, the optic multiplexer 700 has the same configuration as the optic triplexer 302 except that the optic multiplexer 700 has more than the two photodiodes 404 and 406 present in the optic triplexer 302. As shown, the optic multiplexer 700 includes an emitting laser 702, multiple layers of photodiodes 704a, 704b, 704c . . . 704n, and optional TFFs 706a, 706b, 706c . . . 706n. In one embodiment, the optical multiplexer 700 has an emitting laser 702, photodiodes 704a, 704b, 704c . . . 704n and TFFs 706a, 706b, 706c . . . 706n (optional) that are all monolithically formed on a substrate 706 (e.g., InGaAs substrate 706). In another embodiment, the optical multiplexer 700 has an emitting laser 702 that is placed on top of photodiodes 704a, 704b, 704c . . . 704n and TFFs 706a, 706b, 706c . . . 706n (optional) which are monolithically integrated on the substrate 706. It should be noted that the optic multiplexer 700 can be made in the same manner as the optic triplexer 302 except that more than two photodiodes need to be monolithically formed to make the optic multiplexer 700.

Figure 8:
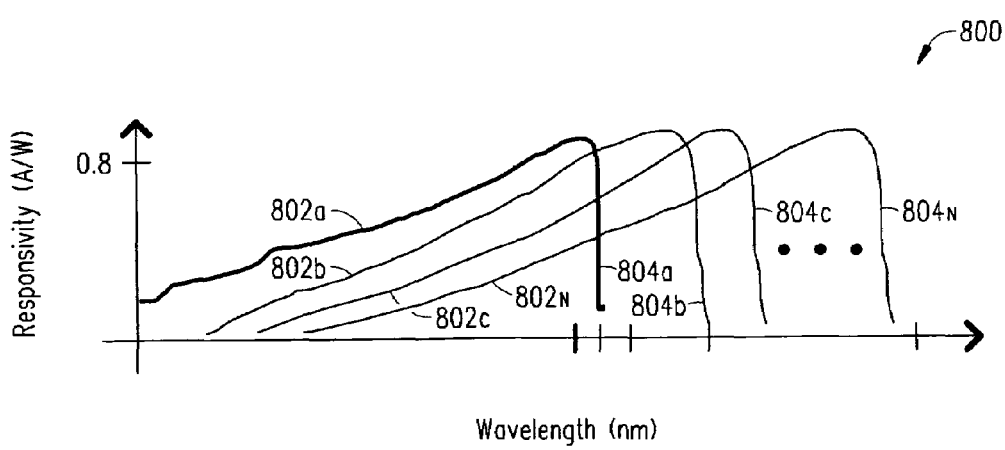
FIG. 8 is a graph that illustrates multiple responsivity curves of multiple photodiodes that are incorporated within the optic demultiplexer shown in FIG. 7.

Referring to FIG. 8, there is a graph 800 that illustrates exemplary responsivity curves 802a, 802b, 802c . . . 802n of the photodiodes 704a, 704b, 704c . . . 704n that are located in the optic multiplexer 700. As can be seen, the last formed photodiode 704a which has the emitting laser 702 located on top of it has a responsivity curve 802a that has a cutoff wavelength 804a that is smaller than the cutoff wavelengths 804b, 804c and 804n of the other photodiodes 704b, 704c and 704n. Likewise, photodiode 704b has a smaller cutoff wavelength 804b than the cutoff wavelength 804c of photodiode 704c which in turn has a smaller cutoff wavelength 804c than the cutoff wavelength 804n of photodiode 704n. As such as shown in FIG. 7, the photodiode 704a detects and absorbs signal 708a that is below the cutoff wavelength 804a and passes through signals 708b, 708c and 708n that are respectively detected and absorbed by photodiodes 704b, 704c and 704n. And, the emitting laser 702 emits signal 703.

Figure 9:
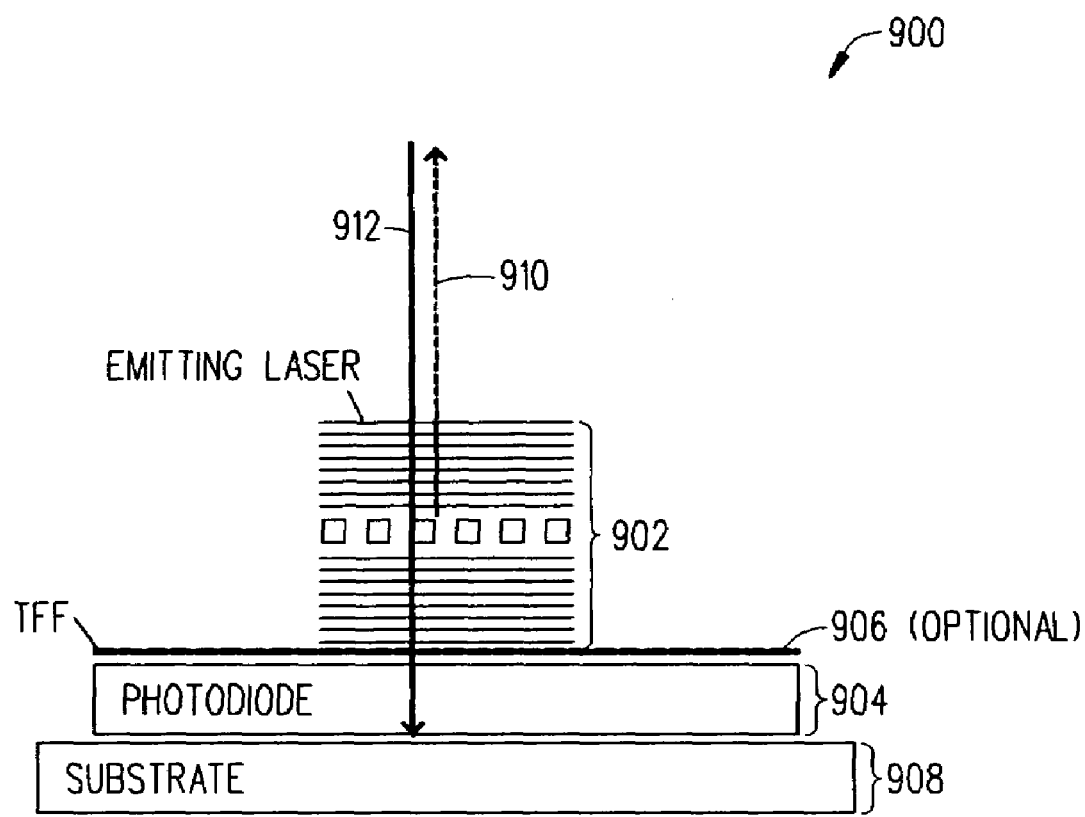
FIG. 9 is a block diagram that illustrates the basic components of an optic diplexer that can be made in accordance with yet another embodiment of the present invention.

Referring to FIG. 9, there is a block diagram that illustrates the basic components of an optic diplexer 900 that can be made in accordance with yet another embodiment of the present invention. Basically, the optic diplexer 900 has the same configuration as the optic triplexer 302 except that the optic diplexer 900 has just one photodiode 904 while the optic triplexer 302 has two photodiodes 404 and 406. As shown, the optic diplexer 900 includes an emitting laser 902 (e.g., 1310 nm VCSEL 902), a photodiode 904 (e.g., 1550 nm photodiode 904) and optional TFF 906 (e.g., 1310 nm reflective TFF 906). The TFF 906 if used is located between the emitting laser 902 and the photodiode 904. The emitting laser 902 emits signal 910 (e.g., 1310 nm signal 910) and the photodiode 904 detects and absorbs signal 912 (e.g., 1550 nm signal 912). In one embodiment, the optic diplexer 900 has an emitting laser 902, photodiode 904 and TFF 706 (optional) that are all monolithically formed on a substrate 908 (e.g., InGaAs substrate 908). In another embodiment, the optic diplexer 900 has an emitting laser 902 that is placed on photodiode 904 and TFF 906 (optional) which are monolithically integrated on the substrate 908. It should be appreciated that the optic diplexer 900 can be made in the same manner as the optic triplexer 700 except that only one photodiode 904 needs to be monolithically formed to make the optic diplexer 900.

Following is a list of some of the other features and advantages associated with the present invention:

The optical triplexer 302 provides superior performance and costs less to produce and assemble than the traditional optical triplexer 102. For example, in the traditional optical triplexer 102 the incoming signals are demultiplexed from common with a reflection off a TFF where the reflections typically provide 15 dB minimum isolation from other signals. In contrast, the optical triplexer 302 has a transmissive design which can provide 40 dB minimum isolation from other signals.

The optical triplexer 302 can provide the optic-to-electric and electric-to-optic conversions for the ONT link on Alcatel's Fiber To The X (FTTX) product. The FTTX product receives two communications channels and transmits one on the same fiber.

It should be appreciated that TFFs are simply a stack of semiconductor materials that utilize metal oxides which reflect certain wavelengths of light and transmit other wavelengths of light.

It should be appreciated that the optic devices described above may have different types of emitting lasers that can be placed on top of a monolithically integrated photodiode or TFF. For instance, the emitting laser can be a VCSEL or a fabry perot laser. In the preferred embodiment, the emitting laser is a VCSEL which is a semiconductor microlaser diode that emits light in a cylindrical beam vertically from the surface of a fabricated wafer (substrate).

It should be appreciated that the optic devices described above may be formed by an InGaAs process or other processes like the InP process, 3–5 platform process and even a nanotechnology process.

The PONs described above can be made in accordance with any standard and is not restricted to any particular standard or specification such as the EPON, BPON, APON and the GPON.

It should be appreciated that the optic devices described herein do not need to be used in a PON but could instead be used in a wide variety of products.

It should be appreciated that an optic device can be made in accordance with the present invention that does not have an emitting laser but has multiple photodiodes that are monolithically integrated on a substrate.

Although several embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. An optic triplexer comprising:
an emitting laser;
a first photodiode;
a second photodiode, wherein said first photodiode and said second photodiode are monolithically integrated on a substrate;
said emitting laser, first photodiode, and second photodiode are axially aligned with an emission axis of said emitting laser; and
a thin film filter located between said emitting laser and one of said first and second photodiodes, wherein said emitting laser, said first photodiode and said second photodiode are packaged within a transistor outline (TO) can and arranged such that optical signals received by said TO can first impinge on said emitting laser before impinging on one of said first photodiode and said second photodiode.

2. The optic triplexer of claim 1, wherein said emitting laser is monolithically integrated on the substrate.

3. The optic triplexer of claim 1, wherein said first photodiode is axially aligned between said emitting laser and said second photodiode.

4. The optic triplexer of claim 1, further comprising a thin film filter located between said first photodiode and said second photodiode.

5. A method for making an optic triplexer, said method comprising the steps of:
providing a substrate;
monolithically forming a photodiode on said substrate;
monolithically forming another photodiode on top of said photodiode;
placing/monolithically forming an emitting laser on top of said another photodiode; and
forming a thin film filter on top of said photodiode before forming said another photodiode; and
forming a thin film filter on top of said another photodiode before placing/monolithically forming said emitting laser.

6. The method of claim 5, wherein:
said emitting laser is capable of transmitting a 1310+/−10 nm optical signal;
said photodiode is capable of receiving a 1550+/−5 nm optical signal; and
said another photodiode is capable of receiving a 1490+/−5 nm optical signal.

7. The method of claim 5, wherein said emitting laser is a vertical cavity surface emitting laser (VCSEL).

8. The method of claim 5, wherein said substrate is an InGaAs substrate.

9. An optic device for transceiving optical signals along an axis, comprising:
a laser selectively emitting a first optical signal along an axis of emission;
a first photodiode detecting a second optical signal;
a second photodiode detecting a third optical signal, wherein said laser, said first photodiode, and said second photodiode are axially aligned with said emission axis; and
said first photodiode being located between said laser and said second photodiode, wherein said laser, said first photodiode and said second photodiode are integrated within a transistor outline (TO) can and arranged such that optical signals received by said TO can first impinge on said emitting laser before impinging on one of said first photodiode and said second photodiode.

10. The optical device of claim 9 further comprising;
a first filter located between said laser and said first photodiode; and
a second filter located between said first photodiode and said second photodiode.

11. The optical device of claim 10, wherein said first filter is adapted for filtering said first optical signal and said second filter is adapted for filtering said second optical signal.

12. The optical device of claim 10, wherein said laser, said first photodiode, said second photodiode, said first filter, and said second filter are integrated within a transistor outline (TO) can and arranged such that optical signals received by said TO can first impinge on said emitting laser before impinging on one of said first photodiode and said second photodiode.

* * * * *